United States Patent [19]

Matsumoto et al.

[11] Patent Number: 5,300,814
[45] Date of Patent: Apr. 5, 1994

[54] SEMICONDUCTOR DEVICE HAVING A SEMICONDUCTOR SUBSTRATE WITH REDUCED STEP BETWEEN MEMORY CELLS

[75] Inventors: Susumu Matsumoto; Shin Hashimoto, both of Hirakata; Toshio Yamada, Kadoma; Yoshiro Nakata, Ikoma, all of Japan

[73] Assignee: Matsushita Electric Industrial Co., Ltd., Osaka, Japan

[21] Appl. No.: 915,898

[22] Filed: Jul. 17, 1992

[30] Foreign Application Priority Data

Jul. 18, 1991 [JP] Japan .................... 3-178080

[51] Int. Cl.⁵ ...................... H01L 23/48; H01L 29/46
[52] U.S. Cl. ................... 257/758; 257/296; 257/659; 257/920
[58] Field of Search ............... 257/758, 756, 296, 306, 257/920, 659

[56] References Cited

U.S. PATENT DOCUMENTS 4,679,171 7/1987 Logwood et al. .................. 257/659
5,110,762 5/1992 Nakahara et al. .................. 257/758

FOREIGN PATENT DOCUMENTS 97665 5/1985 Japan .................... 257/296
64-81358 3/1989 Japan .

Primary Examiner—Rolf Hille
Assistant Examiner—Robert Limanek
Attorney, Agent, or Firm—Ratner & Prestia

[57] ABSTRACT

A semiconductor device comprising a semiconductor substrate, a plurality of memory cell regions each having a plurality of memory cells disposed on the semiconductor substrate, a word line formed in a first level above the semiconductor substrate, a bit line formed in a second level above the first level, and a backing line having a lower resistance than the word line and formed in a third level above the second level. A dummy bit line is formed in the second level outside the memory cell region so as to reduce the step formed at the periphery of the memory cell region. The dummy bit line is also used to interconnect the word line and the backing line so that an electrical connection therebetween is stabilized.

3 Claims, 4 Drawing Sheets

| | PRESENT INVENTION | | | | | | | | PRIOR ART | | | | | | |
|---|---|---|---|---|---|---|---|---|---|---|---|---|---|---|---|
| | REGION B | | | REGION A | | | | | REGION B | | | REGION A | | | |
| LAYER | REFERENCE NUMERAL | THICKNESS (nm) | LAYER | REFERENCE NUMERAL | THICKNESS (nm) | LAYER | REFERENCE NUMERAL | THICKNESS (nm) | LAYER | REFERENCE NUMERAL | THICKNESS (nm) | LAYER | REFERENCE NUMERAL | THICKNESS (nm) |
| POLYSILICON FILM OF BIT LINE | 8a | 90 | POLYSILICON FILM OF DUMMY BIT LINE | 19a | 90 | POLYSILICON FILM OF BIT LINE | 8a | 90 | *** | *** | *** |
| SILICIDE FILM OF BIT LINE | 8b | 150 | SILICIDE FILM OF DUMMY BIT LINE | 19b | 150 | SILICIDE FILM OF BIT LINE | 8b | 150 | *** | *** | *** |
| INTERLEVEL INSULATING FILM | 9 | 300 | INTERLEVEL INSULATING FILM | 9 | 300 | INTERLEVEL INSULATING FILM | 9 | 300 | INTERLEVEL INSULATING FILM | 9 | 300 |
| STORAGE NODE | 10 | 500 | *** | *** | *** | STORAGE NODE | 10 | 500 | *** | *** | *** |
| CAPACITOR INSULATING FILM | 11 | 5 | *** | *** | *** | CAPACITOR INSULATING FILM | 11 | 5 | *** | *** | *** |
| PLATE ELECTRODE | 12a | 100 | DUMMY PLATE ELECTRODE | 12a | 100 | PLATE ELECTRODE | 12a | 100 | *** | *** | *** |
| INTERLEVEL INSULATING FILM | 13 | 500 | INTERLEVEL INSULATING FILM | 13 | 500 | INTERLEVEL INSULATING FILM | 13 | 500 | INTERLEVEL INSULATING FILM | 13 | 500 |
| TOTAL THICKNESS | | 1645 | TOTAL THICKNESS | | 1140 | TOTAL THICKNESS | | 1645 | TOTAL THICKNESS | | 800 |
| STEP BETWEEN REGIONS A AND B | | 505 | | | | STEP BETWEEN REGIONS A AND B | | 845 | | | |

FIG. 7

SEMICONDUCTOR DEVICE HAVING A SEMICONDUCTOR SUBSTRATE WITH REDUCED STEP BETWEEN MEMORY CELLS

BACKGROUND OF THE INVENTION

1. Field of the Invention:

The present invention relates to a semiconductor device, and more particularly relates to a semiconductor device in which a signal delay at a lower level line made of a material having a comparatively high resistance and high melting point, such as polysilicon, is compensated by an upper level line made of a material having a comparatively low resistance, such as aluminum. The present invention also relates to a process for fabricating such a semiconductor device.

2. Description of the Prior Art:

Since the packing density of a semiconductor device in which a number of semiconductor elements are integratedly formed on one chip has been enlarged, the length of wiring interconnecting the elements on the chip has been increased. On the other hand, the width of the wiring has been reduced so as to enhance the packing density. Generally, a long and narrow wiring has a high resistance. Wiring having a high resistance causes a problem of signal delay, which reduces the operation speed of the semiconductor device.

In a dynamic random access memory (DRAM), material having a low resistance and low melting point such as aluminum can not be used for a word line because it is not durable in the fabricating process of the semiconductor device. Instead, a material having a relatively high resistance and high melting point such as polysilicon and polycide is used. In such a DRAM, in order to prevent the problem of signal delay that occurs at the word line, another wiring made of aluminum is formed above the word line so as to run substantially in parallel with the word line. This aluminum wiring, called a "backing line", is connected to the word line at a plurality of points.

A conventional semiconductor device provided with the backing line will be described in detail. FIGS. 5A and 5B show partial sectional views of such a conventional semiconductor device. The semiconductor device has a structure of stacked capacitor cells. Referring to FIG. 5A, a part of the semiconductor device shown as B (right side of the dash-dot line in the figure) is a memory cell region having a plurality of memory cells. The other part of the semiconductor device shown as A (left side of the dash-dot line in the figure) is a memory cell peripheral region surrounding the memory cell region B. In the memory cell region B, a plurality of MOSFETs and memory capacitors connected to the respective MOSFETs are arranged in a matrix.

FIG. 6 schematically shows four memory cell regions B and the memory cell peripheral regions A surrounding these memory cell regions B. Each memory cell region B includes 256×64 memory cells arranged in a matrix. Each of the memory cells is connected to a word line 4 and a bit line 8. Thus, totally 256 word lines 4 and 64 bit lines 8 run through one memory cell region B. Each word line 4 and an aluminum backing line 15 running in parallel with the word line 4 are connected to each other in the memory cell peripheral region A, not in the memory cell region B. Sense amplifiers are also disposed in the memory cell peripheral region A.

Referring to FIGS. 5A and 5B, the structure of the conventional semiconductor device will be described. The semiconductor device comprises a semiconductor substrate 1, a level of the word lines 4, a level of the backing lines 15, and a level of bit lines 8 disposed between the above two levels. The bit lines 8 run transversely to the direction of the word lines 4 and the backing lines 15 (FIG. 6). Each bit line 8 is composed of a polysilicon film 8a as a lower layer and a silicide film 8b as an upper layer.

A field oxide film 2 is formed between the semiconductor substrate 1 and the word lines 4. As shown in FIG. 5B, each word line 4 is covered with an upper insulating film 5 on the top surface thereof and with side-wall insulating films 6 on the sides thereof. A first interlevel insulating film 18 is formed between the word lines 4 and the bit lines 8 for insulating them from each other. The bit lines 8 are electrically connected to sources of transistors in the memory cell region B through respective contact holes (not shown) formed through the first interlevel insulating film 18.

A second interlevel insulating film 9 is formed over the first interlevel insulating film 18 so as to cover the bit lines 8. On the second interlevel insulating film 9 in the memory cell region B, memory capacitors comprising storage nodes 10, capacitor insulating films 11, and a plate electrode 12a are formed. Each storage node 10 is connected to a drain (not shown) of the corresponding transistor.

A third interlevel insulating film 13 is formed over the second interlevel insulating film 9 so as to cover the plate electrode 12a. In the memory cell peripheral region A, contact holes 17 having a high aspect ration are formed through the interlevel insulating films 13, 9, and 18 and the upper insulating film 5 to reach the word lines 4. Each contact hole 17 has a tungsten (W) plug 14 formed therein. Thus, each aluminum backing line 15 having a low resistance is electrically connected to the corresponding word line 4 through the tungsten plug 14. The backing line 15 runs above the word line 4 substantially in parallel therewith.

As described above, the memory cell region B includes the bit lines 8 (thickness: about 240 nm), the storage nodes 10 (thickness: about 500 nm), the capacitor insulating films 11 (thickness: about 5 nm), and the plate electrode 12a (thickness: about 100 nm), which are not formed in the memory cell peripheral region A. Therefore, the third interlevel insulating film 13 in the memory cell region B is formed in a higher position than that in the memory cell peripheral region A by the total thickness of the above layers (about 845 nm), producing a step of that height at the boundary between the memory cell region B and the memory cell peripheral region A. This step causes the following problems in the photolithography and etching processes:

(1) Since the height of the step exceeds the allowable depth of focus for the photolithography (normally, no more than about 800 nm), a precise focusing on both the memory cell region B and the memory cell peripheral region A is not possible. Thereby, it is difficult to form a fine resist pattern on the semiconductor device.

(2) An aluminum film formed by sputtering on the vertical side of the step portion is thinner than that on the flat portion. Thereby, the reliability of the aluminum backing line 15 including such a thin film portion is lowered.

(3) The thickness of the aluminum film in the direction vertical to the substrate 1 is larger at the step portion than at the flat portion. Therefore, after the aluminum film is etched by a high anisotropic etching method, some aluminum tends to be left behind on the side of the step portion. Such aluminum left behind on the side of the step portion may cause a short circuit between the aluminum backing lines 15.

(4) Tungsten (or polysilicon) is deposited on the entire surface of the third interlevel insulating film 13 and then etched back so as to form a CVD tungsten plug (or a CVD polysilicon plug) inside the contact hall 17 by a blanket method. After the etching back, some of the tungsten (or the polysilicon) tends to be left behind on the step portion.

Further, in the conventional semiconductor devices, the aspect ratio of the contact hole 17 for connecting the aluminum backing line 15 with the word line 4 is high (about 3.5 to 5.0). It is difficult to form the tungsten plug 14 through the contact hole 17 having a high aspect ratio.

SUMMARY OF THE INVENTION

The semiconductor device of this invention including a semiconductor substrate and a plurality of memory cell regions each having a plurality of memory cells disposed on the semiconductor substrate, comprises a first conductive layer formed in a first level located above the semiconductor substrate; a second conductive layer formed in a second level located above the first level; and a third conductive layer formed in a third level located above the second level, the third conductive layer having a lower resistance than the first conductive layer: wherein the second conductive layer comprises a wiring portion and a dummy portion, the dummy portion being disposed outside the memory cell regions and interconnecting the first conductive layer and the third conductive layer.

In another aspect of the present invention, a process for fabricating a semiconductor device is provided. The process comprises the steps of: forming a word line on a semiconductor substrate; forming a first insulating film on the semiconductor substrate so as to cover the word line; forming a first contact hole through the first insulating film to reach the word line; forming a conductive film on the first insulating film; patterning the conductive film to form a bit line and a dummy bit line electrically separated from each other, the dummy bit line being connected to the word line through the first contact hole; forming a second insulating film on the first insulating film so as to cover the bit line and the dummy bit line; forming a second contact hole through the second insulating film to reach the dummy bit line; and forming a backing line on the second insulating film, the backing line being connected to the dummy bit line through the second contact hole.

According to the semiconductor device of the present invention, the second conductive layer formed in the second level includes the first portion functioning as a wiring and the second portion that does not function as a wiring but formed as a dummy outside the memory cell regions. As a result, a step produced at the periphery of each memory cell region by the existence of the first portion of the second conductive layer is reduced. Hence, decrease in the production yield caused by the step is prevented. Further, the first conductive layer and the third conductive layer are connected to each other, not through one contact hole as in the conventional semiconductor device, but indirectly through the second portion of the second conductive layer located outside the memory cell regions. As a result, a stable electrical connection between the first conductive layer and the third conductive layer can be achieved.

Especially, when the semiconductor device of the present invention comprises a plurality of memory cell regions each having a plurality of memory cells disposed on the semiconductor substrate, the word line as the first conductive layer, the bit line as the first portion of the second conductive layer, the dummy bit line as the second portion of the second conductive layer, and the backing line as the third conductive layer, a semiconductor device having a high integration level in which signal delay at the word line is compensated by the backing line can be obtained with a high production yield.

Thus, the invention described herein makes possible the advantage of providing a semiconductor device in which a step at the boundary between the memory cell region and the memory cell peripheral region can be reduced and the electrical connection between the word line and the backing line can be stabilized. A process for fabricating such a semiconductor device is also provided.

These and other advantages of the present invention will become apparent to those skilled in the art upon reading and understanding the following detailed description with reference to the accompanying figures.

BRIEF DESCRIPTION OF THE DRAWINGS

FIG. 7 is a table for comparing the present invention with a prior art.

DESCRIPTION OF THE PREFERRED EMBODIMENTS

Figure 4A:
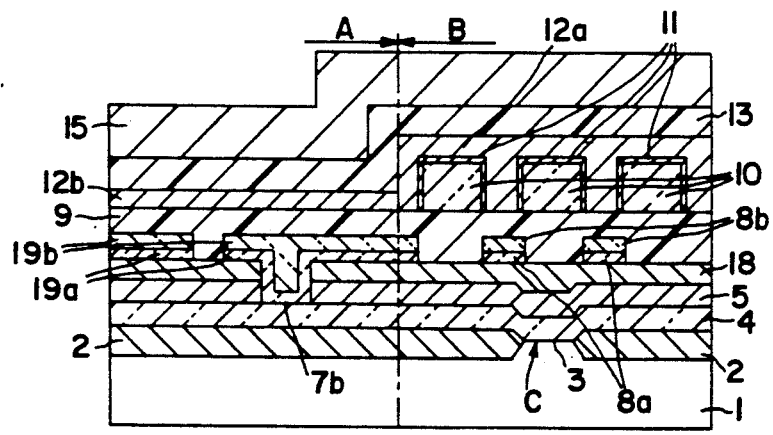
FIGS. 4A and 4B are partial sectional views of the semiconductor device of FIG. 1, taken along line X—X of FIG. 1 for FIG. 4A and line Y—Y for FIG. 4B.
Figure 4B:
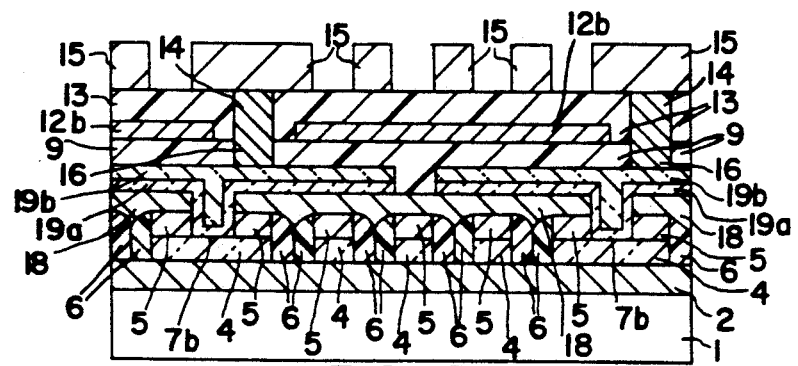
Figure 6:
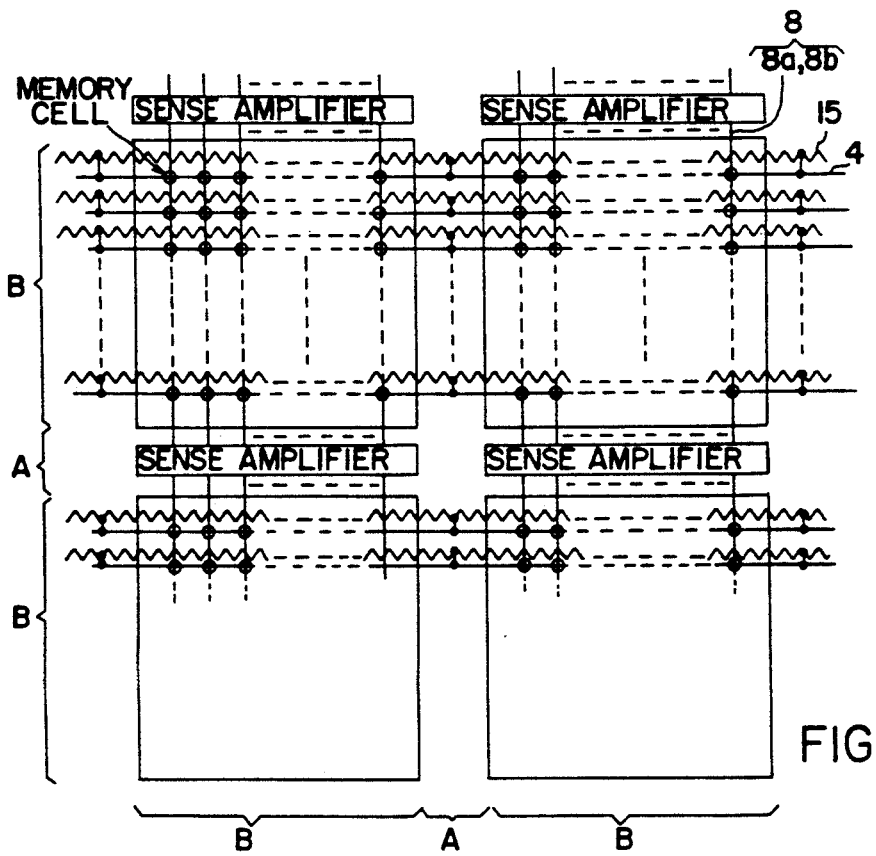
FIG. 6 is a schematic plan view of part of a semiconductor device showing four memory cell regions and their peripheral regions.

FIGS. 4A and 4B are partial sectional views of a semiconductor device, which is a DRAM, according to the present invention. In FIG. 4A, a part of the semiconductor device shown as B (right side of the dash-dot line in the figure) is a memory cell region having a plurality of memory cells. The other part of the semiconductor device shown as A (left side of the dash-dot line in the figure) is an memory cell peripheral region. In the memory cell region B, a plurality of MOSFETs and a plurality of memory capacitors connected to the respective MOSFETs are arranged in a matrix. This planar arrangement is the same as that of the conventional semiconductor device, which is schematically shown in FIG. 6.

Figure 1:
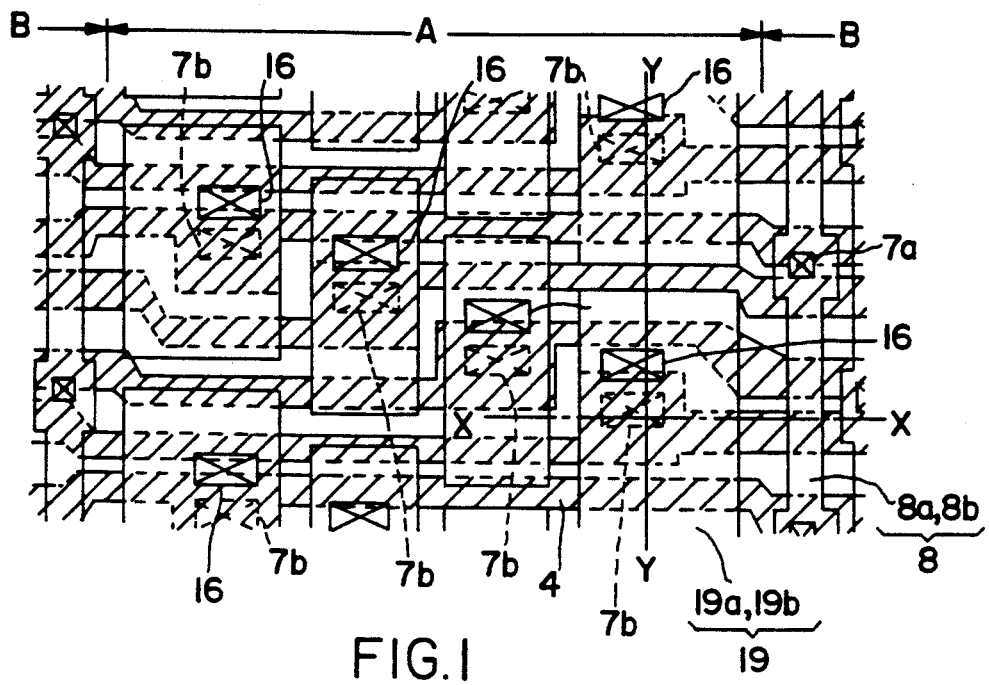
FIG. 1 is a partial structural plan view of a semiconductor device according to the present invention.

FIG. 1 is a plane layout of the memory cell peripheral region A of the semiconductor device of the present invention. A section taken along line X—X in this figure is shown as FIG. 4A and a section taken along line Y—Y as FIG. 4B. Referring to FIG. 1, the areas patterned with oblique lines show word lines 4. In the memory cell region B, bit lines 8 run transversely to the direction of the word lines 4. Each bit line 8 is composed of a polysilicon film 8a as a lower layer and a silicide film 8b as an upper layer. Contact holes 7a are formed in the memory cell region B for connecting the bit lines 8 to corresponding source/drain regions of transistors (not shown).

In the memory cell peripheral region A, dummy bit lines 19 corresponding to the number of the word lines 4 are formed. Each dummy bit line 19 is composed of a polysilicon film 19a as a lower layer and a silicide film 19b as an upper layer. In the region A, some portions of the word lines 4 are wider than other portions thereof, and on each of such widened portions of the word lines 4, a large contact hole 7b is formed for connecting the word line 4 with the corresponding dummy bit line 19. As shown in FIG. 1, the location of the widened portion of one word line 4 is deviated from that of the adjacent word line 4 in the direction of the length of the word line 4, so that the pitch of the word lines 4 does not increase in the memory cell region B by the formation of the widened portions.

Aluminium backing lines 15 are formed substantially right above the corresponding word lines 4, though they are omitted in FIG. 1 for simplification. Contact holes 16 for connecting the aluminum backing lines 15 and the dummy bit lines 19 are formed near the positions of the contact holes 7b.

Referring to FIGS. 4A and 4B, the sectional structure of the semiconductor device of the present invention will be described. The semiconductor device comprises a semiconductor substrate (a p-type silicon substrate) 1, a first conductive layer (the word lines 4) constituting a first level formed above the semiconductor substrate 1, a second conductive layer (the bit lines 8 and the dummy bit lines 19) constituting a second level formed above the first level, and a third conductive layer (the aluminum backing lines 15) constituting a third level formed above the second level.

The sectional structure of each of the first to third conductive layers will be described. The first conductive layer comprises the word lines 4 each of which interconnects gates of the memory cell transistors in the memory cell region B and a column decoder (not shown). Referring to FIG. 4A, a portion of the word line 4 located above a channel C of the memory cell transistor functions as the gate electrode of the memory cell transistor. A thin gate insulating film 3 is formed between the word line 4 and the channel C.

The second conductive layer (thickness: 240 nm) comprises the bit lines 8 in the memory cell region B, which are connected to the sources of the memory cell transistors, and the dummy bit lines 19 in the memory cell peripheral region A.

The third conductive layer comprises the low-resistance backing lines 15 for compensating signal delay at the word lines 4. The backing lines 15 run above the word lines 4 substantially in parallel with the word lines 4. The third conductive layer is electrically connected to the word lines 4 at a plurality of places in the memory cell peripheral region A, not in the memory cell region B.

The structure of the semiconductor device of the present invention will be described in detail. A field oxide film 2 is formed between the semiconductor substrate 1 and the word lines 4. The field oxide film 2 includes a LOCOS film, for example. The LOCOS film is formed by selectively oxidizing prescribed portions of the surface of the semiconductor substrate 1. At the other portions of the surface thereof remained uncovered with the field oxide film 2 (active regions), semiconductor elements such as transistors are formed. In the semiconductor device of the present invention, a MOSFET having a channel C in the substrate 1 is formed as the semiconductor element.

As shown in FIG. 4B, each word line 4 is covered with an upper insulating film 5 on the top surface thereof and with side-wall insulating films 6 on the sides thereof. A first interlevel insulating film 18 is formed between the word lines 4 and the bit lines 8 for insulating them from each other. The unevenness produced by the pattern of the word lines 4 is made smooth by the planarized first interlevel insulating film 18.

On the smooth surface of the first interlevel insulating film 18, the bit lines 8 and the dummy bit lines 19 are formed. The bit lines 8 are electrically connected to the sources of the transistors through the contact holes 7a (shown in FIG. 1) in the memory cell region B. The dummy bit lines 19, which are formed in the memory cell peripheral region A, are electrically connected to the word lines 4 through the contact holes 7b formed through the first interlevel insulating film 18. Preferably, the dummy bit lines 19 are formed near the boundary between the memory cell region B and the memory cell peripheral region A, as shown in FIG. 4A. In this embodiment, the right end of the dummy bit line 19 formed nearest to the memory cell region B is located about 100 nm to the right of the dash-dot line in FIG. 4A. However, it may be located about 1000 nm to the left of the dash-dot line so as to achieve the same effect of reducing the step at the boundary.

A second interlevel insulating film 9 is formed over the first interlevel insulating film 18 so as to cover the bit lines 8 and the dummy bit lines 19. On the second interlevel insulating film 9 in the memory cell region B, memory capacitors including storage nodes 10, capacitor insulating films 11, and a plate electrode 12a are formed. Each storage node 10 is connected to the corresponding transistor. The on/off state of the transistor is controlled according to the potential of the corresponding word line 4. When the transistor is on, the bit line 8 and the storage node 10 are electrically connected through the transistor.

On the second interlevel insulating film 9 in the memory cell peripheral region A, a dummy plate electrode 12b is formed. The plate electrode 12a and the dummy plate electrode 12b constitute a fourth conductive layer. A third interlevel insulating film 13 is formed over the second interlevel insulating film 9 so as to cover the plate electrode 12a and the dummy plate electrode 12b. In the memory cell peripheral region A, the contact holes 16 are formed through the second and third interlevel insulating films 9 and 13 at the portions where the dummy plate electrodes 12b are not formed therebetween. Each contact hole 16 has a tungsten (W) plug 14 formed therein. The aluminum backing lines 15 are electrically connected with the corresponding dummy bit lines 19 through the tungsten plugs 14.

In the semiconductor device of the present invention as described above, the dummy bit lines 19 are formed in the memory cell peripheral region A. Therefore, the step on the surface of the third interlevel insulating film 13 produced at the boundary between the memory cell region B and the memory cell peripheral region A is reduced by about 240 nm, compared with that in the conventional semiconductor device. This is further reduced by the formation of the dummy plate electrode 12b having a thickness of 100 nm in the memory cell peripheral region A. It is not necessary to form the dummy plate electrode 12b when the step at the boundary can be sufficiently reduced without the formation of the dummy plate electrode 12b.

Figure 5A:
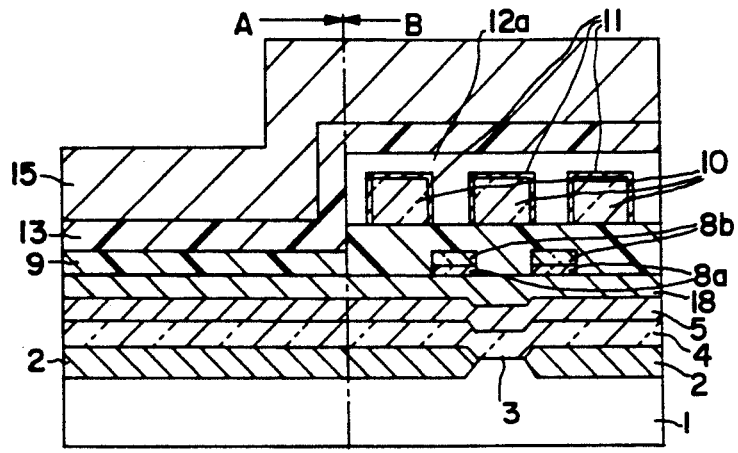
FIGS. 5A and 5B are partial sectional views of a conventional semiconductor device.
Figure 5B:
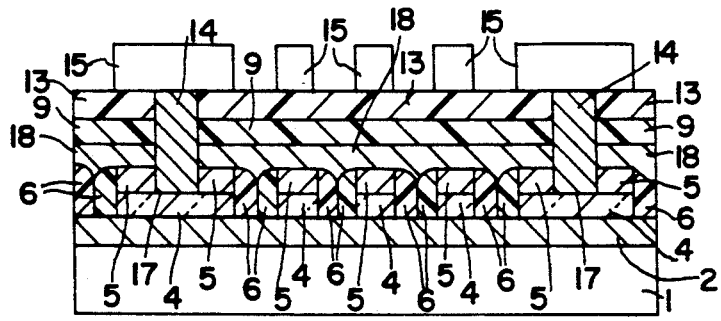

FIG. 7 is a table of the thickness of each layer of both the memory cell region B and the memory cell peripheral region A, together with the height of the step produced between the regions B and A, in the semiconductor device of the present invention as shown in FIGS. 4A and 4B, compared with those in the conventional semiconductor device as shown in FIGS. 5A and 5B. As is apparent from the table, the step can be significantly reduced, from 845 nm in the conventional semiconductor device to 505 nm in the semiconductor device of the present invention.

The process for fabricating the semiconductor device according to the present invention will be described.

In this embodiment, patterning is performed according to a 0.4 μm design rule, so as to form fine patterns preferably by excimer-laser lithography. An electron beam direct writing technique or an i-line phase shift technique may also be employed instead of the excimer-laser lithography.

Figure 2A:
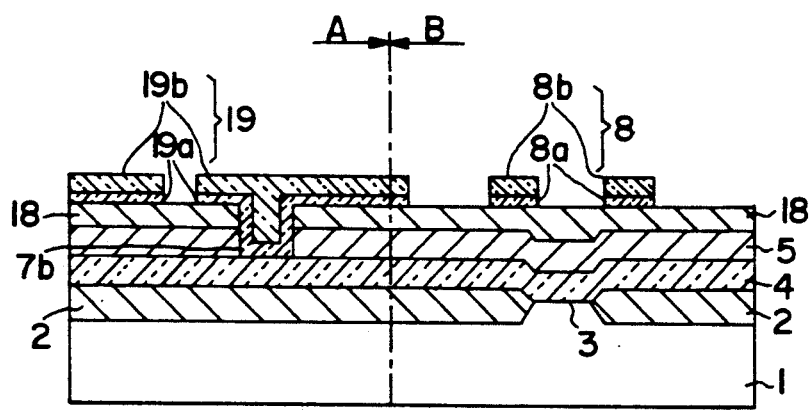
FIGS. 2A and 2B are partial sectional views of the semiconductor device of FIG. 1, taken along line X—X of FIG. 1 for FIG. 2A and line Y—Y for FIG. 2B, at an intermediate stage of a fabricating process according to the present invention.
Figure 2B:
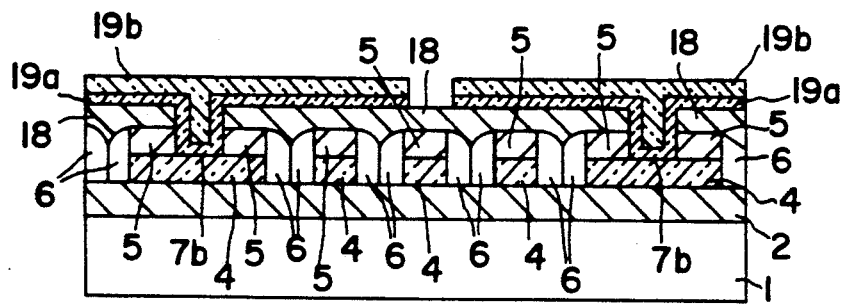

First, referring to FIGS. 2A and 2B, the surface of the semiconductor substrate 1 is selectively oxidized by the LOCOS method so as to form the field oxide film 2 on a prescribed portion of the surface. The other portion thereof on which the field oxide film 2 is not formed functions as an active region.

The surface of the active region is oxidized so as to form the gate insulating film 3. Then, polysilicon is deposited over the field oxide film 2 and the gate insulating film 3 by CVD to form a polysilicon film. Subsequently, an oxide film is formed on the polysilicon film by CVD. The oxide film and the polysilicon film are then patterned, thus to form the word lines 4 and the upper insulating films 5. On the sides of each of the word lines 4 and the upper insulating films 5, the sidewall insulating films 6 are formed by a known method. The word lines 4 may also be formed by patterning a refractory metal film or a refractory metal silicide film having a high melting point, or a polycide film composed of a polysilicon film as a lower layer and a silicide film as an upper layer.

Then, impurity ions are implanted in the active region of the semiconductor substrate 1 by ion implantation so that the source/drain of the transistor (not shown) can be formed by self-alignment with the word line 4.

The first interlevel insulating film 18 is formed over the semiconductor substrate 1 by CVD so as to cover the word lines 4. Then, the surface of the first interlevel insulating film 18 is made smooth employing an etch back technique or a reflow technique. When the reflow technique is employed, the first interlevel insulating film 18 is composed of a non-doped oxide film as a lower layer and a BPSG (boro-phospho silicate glass) film as an upper layer. Since, the BPSG film tends to reflow at a low temperature compared with the non-doped oxide film, the upper surface of the first interlevel insulating film 18 can be made smooth by heat treatment to cause the BPSG film to reflow.

Then, the contact holes 7a and 7b are formed in prescribed portions of the first interlevel insulating film 18. The contact hole 7a (shown only in FIG. 1) is formed in the memory cell region B so as to connect the bit line 8 to the active region (source/drain) of the transistor. On the other hand, the contact hole 7b is formed in the memory cell peripheral region A so as to connect the dummy bit line 19 to the word line 4. The contact hole 7b is formed on the widened portion of the word line 4, so that the precise mask alignment at the photolithography can be easily performed. The contact holes 7a and 7b are simultaneously formed. The contact hole 7b has a depth of about 600 to 800 nm, a diameter of about 350 to 400 nm, and an aspect ratio of 1.5 to 2.3.

Then, a polysilicon film and a silicide film are sequentially formed and patterned together so as to form the bit lines 8 and the dummy bit lines 19 having a polycide structure simultaneously. Each of the dummy bit lines 19 is separated into a plurality of sections, and each section has a function of connecting the corresponding word line 4 and the aluminum backing line 15. The distance between the adjacent dummy bit lines 19 is 0.4 μm, which is the minimum size allowable for the design rule applied. At this stage, each of the dummy bit lines 19 is connected to the respective word line 4 through the contact hole 7b. This connection can be easily performed because the aspect ratio of the contact holes 7b is very small, compared with that of the contact holes 17 of the conventional semiconductor device shown in FIGS. 5A and 5B. A single-layer wiring such as a polysilicon line, a refractory metal line having a high melting point, or a refractory metal silicide line having a high melting point can also be used as the bit line, instead of the polycide line.

Figure 3A:
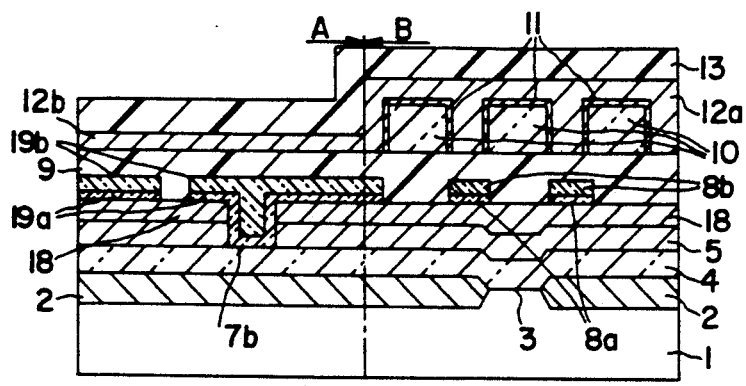
FIGS. 3A and 3B are partial sectional views of the semiconductor device of FIG. 1, taken along line X—X of FIG. 1 for FIG. 3A and line Y—Y for FIG. 3B, at another intermediate stage of the fabricating process according to the present invention.
Figure 3B:
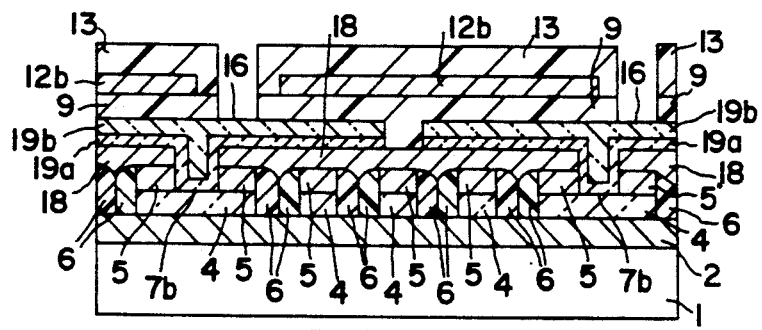

Referring to FIGS. 3A and 3B, the second interlevel insulating film 9 is formed over the bit lines 8 and the dummy bit lines 19. Then, the surface of the second interlevel insulating film 9 is made smooth as in the case of the first interlevel insulating film 18. A contact hole (not shown) is formed through the second and first interlevel insulating films 9 and 18 in the memory cell region B. Then, a phosphorus-doped polysilicon film (P concentration: a few percent) is formed on the second interlevel insulating film 9 and patterned so as to form the storage nodes 10 which are connected to the corresponding active regions of the transistors. The capacitance insulating films 11 made of $SiO_2/Si_3N_4/SiO_2$ (ONO) are formed over the surfaces of the storage nodes 10. A refractory metal such as tungsten or refractory metal silicide may also be used as a material for the storage nodes 10.

The plate electrode 12a is formed on the second interlevel insulating film 9 so that the storage nodes 10 and the capacitance insulating film 11 are buried therein. At this time, the dummy plate electrode 12b is also formed over the surface of the second interlevel insulating film 9 in the memory cell peripheral region A, except for the portions thereof where the contact holes 16 are formed, as well as the marginal portions for photolithography alignment at the formation of the contact holes 16. The plate electrode 12a and the dummy plate electrode 12b are formed by patterning the same conductive film, for example, the phosphorus-doped polysilicon film. A refractory metal such as tungsten or refractory metal silicide may also be used as a material for the plate electrode 12a and the dummy plate electrode 12b. In this embodiment, the thickness of these electrodes 12a and 12b is 100 nm. Also, in this embodiment, as shown in FIG. 3A, the plate electrode 12a and the dummy plate electrode 12b are connected at the step portion (the boundary between the memory cell region B and the memory cell peripheral region A). However, the reduction of the step can also be achieved when these electrodes 12a and 12b are not connected.

The third interlevel insulating film 13 is formed over the second interlevel insulating film 9 so that the plate electrode 12a and the dummy plate electrode 12b are buried therein. The third interlevel insulating film 13 is made smooth by heat treatment, etching back, and the like. A SOG (spin-on-glass) film may be used as the third interlevel insulating film 13. In the memory cell peripheral region A, the contact holes 16 are formed by lithography and etching through the second and third interlevel insulating films 9 and 13 at the portions where the dummy plate electrodes 12b are not formed. Each of the contact holes 16 has a depth of about 800 to 1000 nm, a diameter of about 350 to 400 nm, and an aspect ratio of 2 to 2.9. As indicated above, the aspect ratio of the contact hole 16 is very small, compared with that of the contact hole 17 for connecting the word line 4 and the aluminum backing line 15 of the conventional semiconductor device. Further, the contact hole 16 is formed on the dummy bit line 19 which is wider than the widened portion of the word line 4. Therefore, the precise mask alignment at photolithography can be easily performed.

The tungsten (W) plug 14 is formed inside the contact hole 16 by a selective CVD method. Then, the aluminum backing lines 15 are formed on the third interlevel insulating film 13 by sputtering and aluminum etching. In this way, each of the aluminum backing lines 15 is electrically connected to the word line 4 through the tungsten plug 14 and the dummy bit line 19. The tungsten plug 14 can be easily formed inside the contact hole 16 since the aspect ratio of the contact hole 16 is small. Before the formation of the tungsten plug 14, a barrier metal made of TiN/Ti, for example, may be formed on the bottom surface of the contact hole 16. Then, the tungsten plug 14 can be formed by a blanket W-CVD method. Alternatively, the aluminum backing line 15 may be connected with the dummy bit line 19 directly without the formation of the plug 14.

As described above, according to the fabricating process of the present invention, the aluminum backing line 15 can be connected to the word line 4 by an effective method of forming two kinds of contact holes both having a low aspect ratio. Further, since the conductive material is formed inside the contact hole 16, a contact failure between the aluminum backing line 15 and the dummy bit line 19 is not likely to occur.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
   a semiconductor substrate,
   a plurality of memory cell regions each having a plurality of memory cells disposed on said semiconductor substrate,
   a first conductive layer formed in a first level located above said semiconductor substrate;
   a second conductive layer formed in a second level located above said first level; and
   a third conductive layer formed in a third level located above said second level, said third conductive layer having a lower resistance than said first conductive layer:
   wherein said second conductive layer comprises a wiring portion and a dummy portion, said dummy portion being disposed outside said memory cell regions and interconnecting said first conductive layer and said third conductive layer.

2. A semiconductor device comprising a semiconductor substrate, a first conductive layer formed in a first level located above said semiconductor substrate, a second conductive layer formed in a second level located above said first level, and a third conductive later formed in a third level located above said second level
   wherein said second conductive layer comprises a first portion and a second portion electrically insulated from each other
   said second portion of said second conductive layer interconnects said first conductive layer;
   said first conductive layer includes a word line connected to said memory cells;
   said first portion of said second conductive layer includes bit line connected to said memory cells;
   said second portion of said second conductive layer is located outside said memory cell regions and includes a dummy bit line; and
   said third conductive layer includes a backing line having a lower resistance than said first conductive layer.

3. A semiconductor device comprising a semiconductor substrate, a first conductive layer formed in a first level located above said semiconductor substrate, a second conductive layer formed in a second level located above said first level, and a third conductive layer formed in a third level located above said second level, wherein
   said second conductive layer comprises a first portion and a second portion electrically insulated from each other;
   said second portion of said second conductive layer interconnects said first conductive layer;
   said first conductive layer includes a word line connected to said memory cells;
   said first portion of said second conductive layer includes a bit line connected to said memory cells;
   said second portion of said second conductive layer is located outside said memory cells and includes a dummy bit line; and
   said third conductive layer includes a backing line having a lower resistance than said first conductive layer,
   said semiconductor device further comprising a fourth conductive layer between said second level and said third level, said fourth conductive layer including a plate electrode portion located in said memory cell regions, and being electrically isolated from said first conductive layer and said second conductive layer.

* * * * *

UNITED STATES PATENT AND TRADEMARK OFFICE
CERTIFICATE OF CORRECTION

PATENT NO. : 5,300,814
DATED : April 5, 1994
INVENTOR(S) : Susumu Matsumoto et al.

It is certified that error appears in the above-indentified patent and that said Letters Patent is hereby corrected as shown below:

Column 10, claim 2, line 31, after "includes"
  insert --a--.

Column 10, claim 2, line 21, change "later" to
  --layer--.

Signed and Sealed this

Sixth Day of September, 1994

Attest:

BRUCE LEHMAN

Attesting Officer

Commissioner of Patents and Trademarks